United States Patent [19]

Stein et al.

[11] 3,999,173

[45] Dec. 21, 1976

[54] SERIAL CORE MEMORY ARRAY

[75] Inventors: Morris O. Stein, Wayne; Peter A. Jager, Haledon; J. Fred Rathjen, Franklin Lakes, all of N.J.

[73] Assignee: The Singer Company, Little Falls, N.J.

[22] Filed: Mar. 17, 1975

[21] Appl. No.: 559,315

[52] U.S. Cl. ............... 340/174 MA; 340/174 GP; 340/174 S; 340/174 SC
[51] Int. Cl.² .................................... G11C 11/061
[58] Field of Search ... 340/174 M, 174 MA, 174 SC, 340/174 GP, 174 S

[56] References Cited
UNITED STATES PATENTS

| | | | |
|---|---|---|---|
| 3,127,591 | 3/1964 | Foster | 340/174 SC |
| 3,229,266 | 1/1966 | Rajchman | 340/174 MA |
| 3,551,904 | 12/1970 | Tomaszewski | 340/174 M |
| 3,636,533 | 1/1972 | Rathjen et al. | 340/174 MA |
| 3,699,546 | 10/1972 | McLean | 340/174 MA |
| 3,704,455 | 11/1972 | Scarbrough | 340/174 MA |
| 3,707,705 | 12/1972 | Howell, Jr. | 340/174 MA |
| 3,825,907 | 7/1974 | Sell et al. | 340/174 MA |

OTHER PUBLICATIONS

IBM Tech. Disc. Bull., "Combined Memory Core Plane and Circuit Module," by Betz, vol. 10, No. 11, 4/68, p. 1657.
Bell Labs. Record, "New Memory Reduces No. 1 ESS Cost and Size," by Chevalier et al., 4/72, p. 121–123.
RCA Review, "Monolithic Ferrite Memories," by Abeyta et al., 3/66, pp. 77–97.

Primary Examiner—James W. Moffitt
Attorney, Agent, or Firm—T. W. Kennedy

[57] ABSTRACT

A densely packed low weight, low volume, minimum temperature gradient memory array comprising a bilateral printed circuit board having a plurality of ferrite cores arranged in columns and rows mounted on one side and a plurality of integrated circuit diode flatpacks mounted on the other side. A ground plane comprising a thin metallic layer isolates the core plane from the mounting and also serves as a means for maintaining a minimum temperature gradient across the core plane. A heat conductor removes unwanted heat from the array, and the connections to elements of the array are grouped to reduce wiring runs.

7 Claims, 6 Drawing Figures

SERIAL CORE MEMORY ARRAY

This invention is related to memory array modules. More particularly, this invention is related to a densely packed, low volume memory array having means for maintaining a minimum temperature gradient across the core plane and means for conducting heat away from the device.

BACKGROUND OF THE INVENTION

A memory array comprises a plurality of tiny rings called cores of ferromagnetic material a few hundredths of an inch in diameter. The cores are usually arranged in rows and columns and coordinate leads designated X and Y leads are employed to address a selected core in the matrix. The cores are strung on a wire and a strong electrical current is sent through the wire in order to magnetize them. The direction of current determines the polarity or magnetic state of the core. By reversing the direction of current the magnetic state of the core is changed. Consequently, the two states of the core can be used to represent 0 or 1, plus or minus, yes or no, or on-or-off conditions. For computer purposes this is the basis of the binary system of storing information.

It is desirable in computer applications that the memory unit have a large storage capacity while requiring minimum space and volume. Other desirable characteristics are low power useage, short cable runs, ruggedness, minimum noise pickup and good heat dissipation. Prior art memory units have been characterized by bulky core memory stacks as well as bulky electronic circuitry to drive and sense the memory stack. In addition, with prior art memory units there was a need for additional solder or connector connections between components plus extra hardware for mounting to standard core memories. Through the use of densely packed memory cores and integrated circuit diode flatpacks plus short wiring techniques, the desirable memory array characteristics are achieved by this invention.

BRIEF DESCRIPTION OF THE INVENTION

The present invention provides a memory array in which a bilateral printed circuit board mounts a core plane on one side and six integrated circuit diode flat packs on the other side. The core plane contains two densely packed matrices of 640 cores each for a total of 1280 wide temperature cores. The X and Y currents in the cores are in coincidence in one of the 32 × 20 matrices and in anti-coincidence (cancelling) in the other 32 × 20 matrix. A ground plane in the form of a thin metallic sheet under the core area and overlying the diode packs serves as a means of isolation between the cores and diode packs as well as a means of minimizing the temperature gradient across the core array. A heat conductor connected to the heat sink of the vehicle removes excessive heat from the memory array. Means are provided to insure short wiring runs.

Accordingly, it is an object of this invention to provide a memory array assembly that has maximum packing density, very low profile, low weight, low volume and ruggedness to withstand severe vibration and shock.

It is another object of this invention to provide a memory array assembly that has minimum input/output leads, minimum noise pickup, and good shielding.

It is a further object of this invention to provide a memory array assembly that has a means for maintaining a minimum temperature gradient across the core plane and a heat conductor for conducting heat away from the array.

It is yet another object of this invention to provide a memory array assembly that is useable with a digital computer.

In order to gain a better understanding of the invention, as well as other objects and further features thereof, reference is made to the following detailed description of the invention to be read in conjunction with the accompanying drawings wherein.

Figure 1:
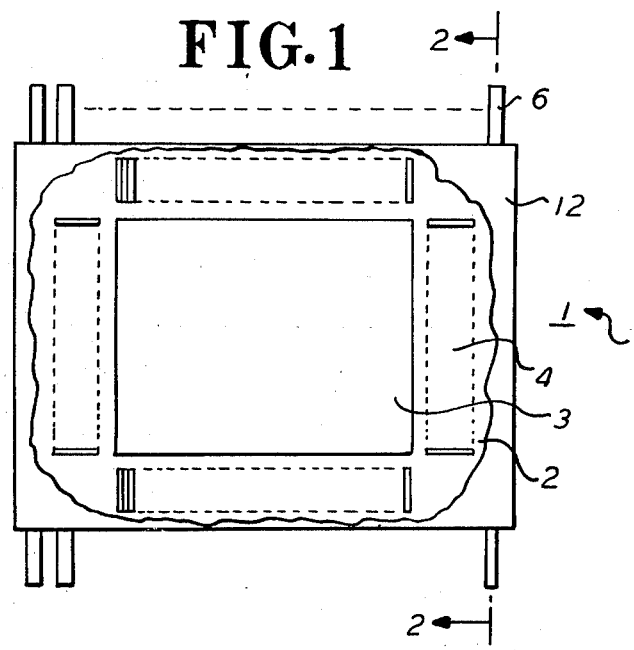
FIG. 1 is a top plan view of the memory array of the invention with the top cover broken away.

Referring to FIG. 1, reference numeral 1 is the memory array of the invention. Reference numeral 2 is a rectangularly shaped printed circuit board upon the top side of which the core plane 3 is mounted. The core plane contains two 32 × 20 matrices for a total of 1280 wide-temperature ferrite cores. Thus, the memory array assembly has a storage capacity of 1280 bits. The X and Y currents are in coincidence in one of the 32 × 20 matrices and in anticoincidence (i.e. cancelling) in the other 32 × 20 matrix. This condition is reversible simply by reversing the direction of the Y current. Each core in the core plane has three wires passing through it. These wires are one X drive wire, one Y drive wire and one sense wire. Each X drive wire threads 40 core and each Y drive wire threads 64 cores. Two sense windings are provided with one sense winding for each matrix of 640 cores.

The printed circuit board also contains termination pads 4 and terminals 6. The conductors on the printed circuit board are formed by conventional acid etching techniques. The dimensions of the memory array is approximately 1.790 inches in length by 1.300 inches in width, having a depth of .180 inches as seen in the cross-sectional view of FIG. 2. Thus, the memory array of the invention represents the smallest known volume occupied by a memory of this storage capacity. The size and construction of the memory array allows for simple assembly techniques to the next higher assembly.

Figure 3:
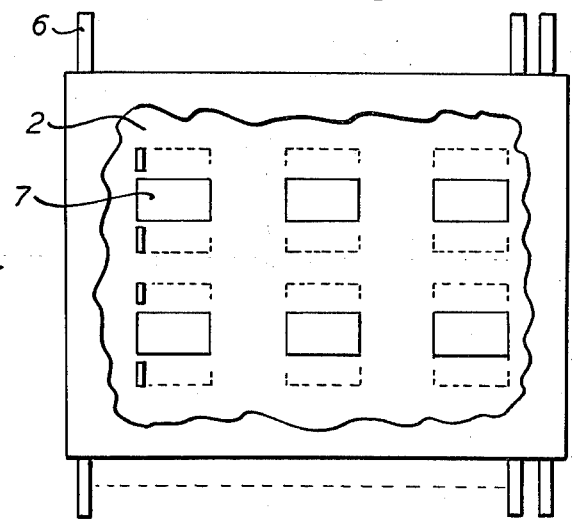
FIG. 3 is a bottom view of the memory array with the bottom cover broken away.

FIG. 3 is a bottom plan view of the memory array with the broken away section showing six diode flat packs 7. Diode selection matrices employing integrated (MSI) circuit diodes are provided on the circuit board as part of the memory array assembly. The diodes 7 are electrically connected to the cores through the conductors provided by the printed circuit board 2 and direct flow of current through the cores.

Figure 2:
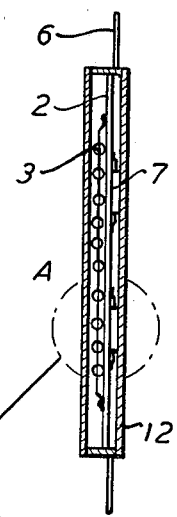
FIG. 2, is a cross sectional view taken along the line 2—2 of FIG. 1.
Figure 4:
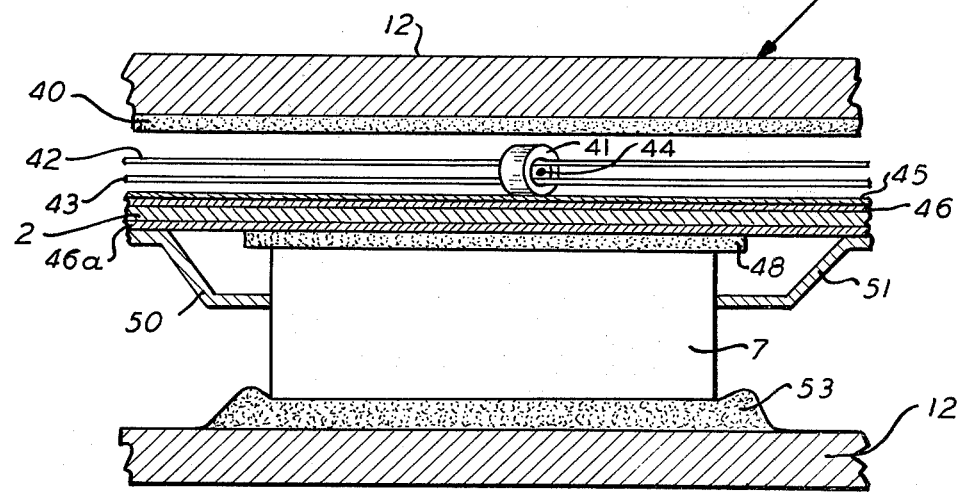
FIG. 4 is an exploded view of a fragment A taken from FIG. 2.

FIG. 4 is an enlarged view of the fragment of Section A of FIG. 2. Starting from the top layer down, reference numeral 12 is the cover overlying the completed package. Cover 12 protects the unit from the entrance of moisture, dust and other undesired particles. The next layer 40 is an insulating layer which isolates the core 41 from the cover and serves as a means for reducing noise and vibrations. Core 41 has sense winding 42 and Y winding 43 threaded through its center from left to right. However, the X winding 44 is threaded through core 41 in a direction out of the page. Core 41 is prevented from movement in the package by a layer of double sided adhesive film tape 45. Underneath tape 45 is a thin metallic layer 46 which is employed as a ground plane to electronically isolate the cores of the array from the mounting and case hardware. The ground plane is electrically connected to output terminal 22 of the assembly and also serves the function of minimizing the temperature gradient across the core plane. Since the ground plane is a thin layer any temperative rise in one spot under a core is rapidly distributed throughout the layer. Thus, minimizing the temperature gradient across the layer. Layer 46 outside the core area is used for wire terminations for the X, Y and sense windings. Layer 46a is another metallic strip used for diode flat pack terminations.

Figure 5:
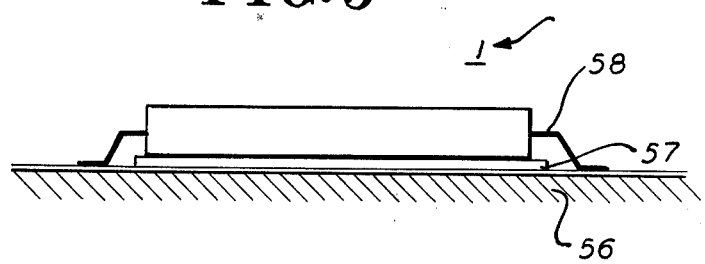
FIG. 5 is a view of the heat sink for removing heat from the entire memory array.

Sandwiched between the ground plane 46 and layer 46a is the epoxy board 2 which provides the support for the cores and the diode packs. A second double sided adhesive film tape 48 isolates the diode flat pack 49 from metallic layer 46a. Preformed diode leads 50 and 51 are connected to metallic layer 46a. A thermal compound 53 provides a heat removal path from the diode flat packs 49 to the bottom cover 12. Thermal compound 53 also provides a means of maintaining equal spacing between metallic layer 46a and cover 12. The bottom of cover 12 rests on a heat sink 56 which conducts heat to itself away from the memory array via thermal compound 57. This is best seen in FIG. 5 which shows the entire memory array assembly mounted on the heat sink.

Figure 6:
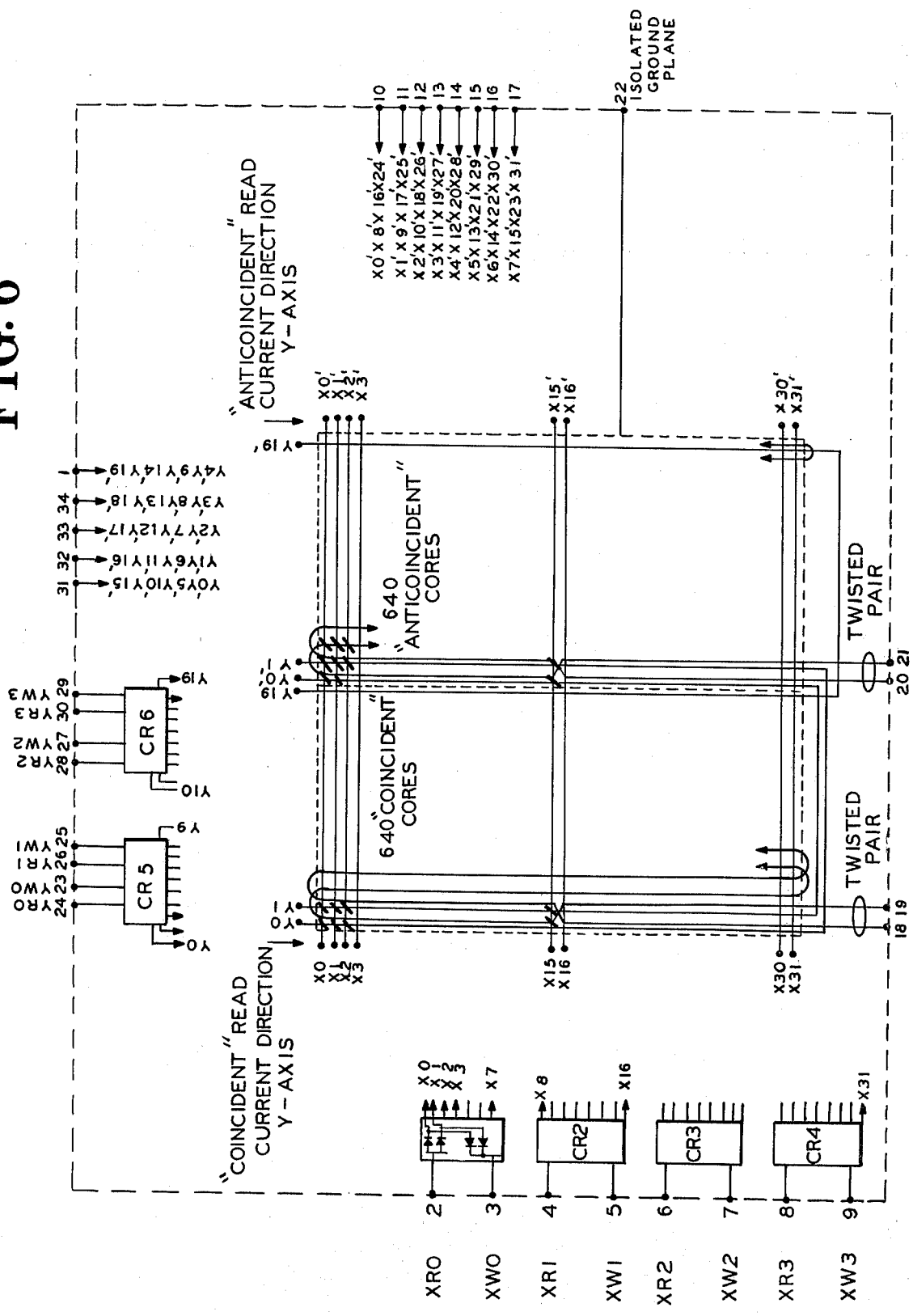
FIG. 6 is a wiring diagram showing typical wiring connections between the diodes and the core matrices.

FIG. 6 shows a simplified wiring diagram of the memory array with the elements re-arranged for the sake of clarity. The X matrix comprises diode flatpacks CR1, CR2, CR3 and CR4 which together contain 64 diodes. The four "read" terminals 2, 4, 6 and 8 of the diode flatpacks are dedicated to the anode X buss line and the four "write" terminals 3, 5, 7 and 9 are dedicated to the cathode X buss line. The other ends of the X lines are bussed in four groups of eight with eight output terminals for each diode pack. For example, CR1 has read terminal at 2 and a write terminal at 3. These terminals are also designated XRO and XWO respectively. The eight output terminals X0 through X7 of CR1 are connected to the corresponding terminals X0 through X7 of the core plane. Diode pack CR2 has read terminl 4 and write terminal 5. The eight output terminals of CR2 are connected to terminal X8 through X15 of the core plane. Diode packs CR3 and CR4 are similarly connected.

The Y matrix comprises diode flatpacks CR5 and CR6. The four read terminals 24, 26, 28 and 30 of these packs are dedicated to anode Y buss lines and the four write terminals 23, 25, 27 and 29 are dedicated to the cathode buss lines. The other ends of the Y lines are bussed in five groups of four with five assembly output terminals 31 through 34, provided. For example, CR5 has read terminals at 24 and 26 and write terminals at 23 and 25. The output terminals of CR5 are designated Y0 through Y9 and are connected to the corresponding terminals of the core plane. Diode pack CR6 is connected similarly to CR5.

To the right of FIG. 6 the X core output terminals are designated X0′ through X31′. These terminals are grouped and connected to assembly output terminals 10 through 17. For example, X0′, X8′, X16′ and X24′ are connected to the output terminal 10, X1′, X9′, X17′ and and X25′ are connected to the output terminal 11. This grouping continues as shown. With the terminal connection as shown, when a positive signal is applied to read terminal 2 or XRO and a ground to X0′ by way of terminal 10, only the X0—X0′ line has a current flow through it. However, no current flows through any other X line. By the same token, when a write signal (a negative pulse) is applied to terminal 3 and a ground to X0′ by way of terminal 10, a current flows through line X0—X0′ in the opposite direction. However, no current flows in any other X line.

The Y output terminals 31, 32, 33, 34 and 1, shown at the top of FIG. 6 are grouped in a similar manner. Therefore, if it is desired to read the core at the intersection of X0 and Y0, a positive signal is applied at terminal 2 and ground at terminal 10 thus setting up a current flow through the core in the X plane. Simultaneously, a positive signal is applied to Y terminal 24 and a ground to terminal 31 which causes a current flow through the core in the Y line. Thus, this selected core can be read. It is to be noted that the same Y wire passes through the coincident cores as well as the anticoincident cores. Thus, at the point where the X and Y wires enter the core in the same direction coincidence occurs. Conversely, where the X and Y wires enter the core from different directions anticoincidence occurs. This condition is reversible by changing the direction of the current in the Y line.

The sense windings at terminals 18, 19 and 20, 21 in each array are bow tie wound and parallel to the Y drive winding with cross-overs between X15 and X16. The isolated ground plane is brought out at terminal 22. All cores are mounted on the ground plane and are electrically isolated from any mounting or case hardware.

From the foregoing, a memory array assembly having a densely packed core plane, short run electrical wiring connections, low weight, low volume and low power requirements plus minimum temperature gradient means has been described.

The invention is not limited to the embodiments described above and all changes and modifications thereof not constituting departures from the spirit and scope of the invention are intended to be covered by the following claims.

What is claimed is:
1. A memory array assembly comprising:
a. a printed circuit board having thin metallic layers overlaying the central portion of both sides of said board;
b. first double-sided adhesive film tape overlaying said metallic layer on one side of said board;
c. a plurality of densely packed magnetic cores arranged in rows and columns forming a core plane having a plurality of terminals adjacent said adhesive tape;
d. a plurality of integrated circuit diode flatpacks forming a selection matrix for addressing said cores and having grouped terminal connections to said cores which are substantially less than said core terminals disposed on the other side of said board;
e. second double sided adhesive film tape interposed between each diode flat pack and the metallic layer on the other side of said board;
f. a cover substantially surrounding said board with said array and diode flatpacks disposed thereon:

g. first insulating means on the inside of said cover adjacent said array; and h. thermal conducting means filling the space between said cover and each diode flatpack, whereby said metallic layers will maintain a temperature gradient across said cores, said adhesive tape will prevent movement of said cores, said insulating means will shield said cores from vibrations and said thermal means will transfer heat from said array and said flatpacks to said cover.

2. The memory array of claim 1 comprising:
a heat sink in contact with said cover whereby a path for conducting heat from said memory is established.

3. The memory array of claim 1 wherein said board is an epoxy board.

4. The memory array of claim 1 comprising:
X wire diode flatpacks having four read input terminals and four write input terminals each individual input terminal of said X diode flatpack bussed to connect at least five output terminals of said X diode flatpack for addressing the X wires of said cores whereby the X diode conductor connections to the X wires of said cores are substantially reduced.

5. The memory array of claim 4 comprising:
Y wire diode flatpacks having four read input terminals and four write input terminals each individual input terminal of said Y diode flatpack bussed to connect to at least five output terminals of said diode flatpacks for addressing the Y wires of said cores whereby the Y conductor connections to said Y wire of said cores are substantially reduced.

6. The memory array of claim 5 comprising:
four X wire diode flatpacks each of said X flatpacks having two input terminals and eight output terminals, means for connecting at least thirty two X line core input terminals to the output terminals of said four X wire diode flatpacks, means for connecting at least thirty two X line core output terminals to at least eight X line assembly output terminals each of said assembly output terminals grouping together at least one output terminal of each X wire diode flatpack.

7. The memory array of claim 6 comprising:
two Y line diode flatpacks each pack having four input terminals and ten output terminals, means for connecting at least twenty Y line core input terminals to at least five Y line assembly output terminals each of said assembly output terminals grouping together at least two terminals of each Y wire diode flatpack.

* * * * *